US011735497B2

(12) United States Patent
Noma et al.

(10) Patent No.: US 11,735,497 B2
(45) Date of Patent: Aug. 22, 2023

(54) INTEGRATED PASSIVE DEVICE AND FABRICATION METHOD USING A LAST THROUGH-SUBSTRATE VIA

(71) Applicant: SEMICONDUCTOR COMPONENTS INDUSTRIES, LLC, Phoenix, AZ (US)

(72) Inventors: Takashi Noma, Ota (JP); Hideyuki Inotsume, Kumagaya (JP); Kazuo Okada, Ota (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 688 days.

(21) Appl. No.: 16/722,419

(22) Filed: Dec. 20, 2019

(65) Prior Publication Data

US 2020/0126894 A1 Apr. 23, 2020

Related U.S. Application Data

(62) Division of application No. 15/813,710, filed on Nov. 15, 2017, now Pat. No. 10,535,585.

(Continued)

(51) Int. Cl.
*H01L 21/768* (2006.01)
*H01L 21/683* (2006.01)
(Continued)

(52) U.S. Cl.
CPC .......... *H01L 23/481* (2013.01); *H01L 21/288* (2013.01); *H01L 21/2885* (2013.01); *H01L 21/304* (2013.01); *H01L 21/3065* (2013.01);
*H01L 21/31116* (2013.01); *H01L 21/6836* (2013.01); *H01L 21/76873* (2013.01); *H01L 21/76874* (2013.01); *H01L 21/76879* (2013.01); *H01L 21/76898* (2013.01); *H01L 21/78* (2013.01); *H01L 23/5223* (2013.01); *H01L 23/5227* (2013.01); *H01L 23/5283* (2013.01); *H01L 23/53238* (2013.01); *H01L 24/03* (2013.01); *H01L 24/05* (2013.01); *H01L 24/11* (2013.01); *H01L 24/13* (2013.01);

(Continued)

(58) Field of Classification Search
CPC .......... H01L 21/6836; H01L 21/76898; H01L 21/78; H01L 23/5223; H01L 23/5227
See application file for complete search history.

(56) References Cited

U.S. PATENT DOCUMENTS 6,800,920 B2 * 10/2004 Nishijima ............. H01L 23/645
  438/957
9,276,104 B2 * 3/2016 Tsunemi ................. H01L 21/84
(Continued)

*Primary Examiner* — Phat X Cao
(74) *Attorney, Agent, or Firm* — Brake Hughes Bellermann LLP

(57) ABSTRACT

A method for making an integrated passive device (IPD) die includes grinding a backside of a semiconductor substrate to reduce a thickness of a central portion of the semiconductor substrate while leaving a mechanical support ring on an outer portion of the substrate, and forming a through-substrate via (TSV) from the backside of the substrate. The TSV defines interconnect access to at least one passive component embedded in an insulator material disposed on a front surface of the semiconductor substrate. The substrate has a thickness less than three-quarters of an original thickness of the substrate.

20 Claims, 10 Drawing Sheets

Related U.S. Application Data

(60) Provisional application No. 62/549,206, filed on Aug. 23, 2017.

(51) Int. Cl.

| | | |
|---|---|---|
| *H01L 21/78* | (2006.01) | |
| *H01L 23/522* | (2006.01) | |
| *H01L 23/48* | (2006.01) | |
| *H01L 23/532* | (2006.01) | |
| *H01L 23/00* | (2006.01) | |
| *H01L 21/304* | (2006.01) | |
| *H01L 21/3065* | (2006.01) | |
| *H01L 21/311* | (2006.01) | |
| *H01L 21/288* | (2006.01) | |
| *H01L 23/528* | (2006.01) | |
| *H01L 49/02* | (2006.01) | |

(52) U.S. Cl.
CPC .............. *H01L 28/10* (2013.01); *H01L 28/20* (2013.01); *H01L 28/40* (2013.01); *H01L 2221/6834* (2013.01); *H01L 2221/68327* (2013.01); *H01L 2224/02372* (2013.01); *H01L 2224/0401* (2013.01); *H01L 2224/04026* (2013.01); *H01L 2224/0557* (2013.01); *H01L 2224/05548* (2013.01); *H01L 2224/05572* (2013.01); *H01L 2224/05647* (2013.01); *H01L 2224/13024* (2013.01); *H01L 2224/13025* (2013.01); *H01L 2224/32225* (2013.01); *H01L 2924/19011* (2013.01); *H01L 2924/19041* (2013.01); *H01L 2924/19042* (2013.01); *H01L 2924/19043* (2013.01)

(56) References Cited

U.S. PATENT DOCUMENTS

| | | | |
|---|---|---|---|
| 9,397,038 B1 | 7/2016 | Uzoh et al. | |
| 9,997,481 B2* | 6/2018 | Chen | H01L 23/481 |
| 11,037,904 B2* | 6/2021 | Yu | H01L 21/78 |
| 2006/0118931 A1 | 6/2006 | Ho et al. | |
| 2009/0266586 A1 | 10/2009 | Sato et al. | |
| 2010/0019387 A1* | 1/2010 | Miura | H01L 23/481 |
| | | | 257/773 |
| 2010/0059879 A1 | 3/2010 | Bielen | |
| 2010/0065942 A1 | 3/2010 | Lin et al. | |
| 2011/0304026 A1* | 12/2011 | Tsui | H01L 23/481 |
| | | | 257/E21.597 |
| 2012/0074585 A1 | 3/2012 | Koo et al. | |
| 2012/0153430 A1 | 6/2012 | Bachman et al. | |
| 2012/0175731 A1 | 7/2012 | Chen et al. | |
| 2016/0079203 A1* | 3/2016 | Xue | H01L 24/94 |
| | | | 438/110 |
| 2016/0095221 A1 | 3/2016 | Ramachandran et al. | |

\* cited by examiner

```
                                         ┌─ 500
                                       ↙
┌─────────────────────────────────────────────────┐
│  Grind a backside of a semiconductor substrate  │
│      to reduce a thickness of a central         │
│  portion of the semiconductor substrate while   │
│  leaving a mechanical support ring on an outer  │
│            portion of the substrate 510         │
└─────────────────────────────────────────────────┘
                        │
                        ▼
┌─────────────────────────────────────────────────┐
│  Form a through-substrate via (TSV) from the    │
│  backside of the substrate where the TSV        │
│  defines interconnect access to at least one    │
│  passive component embedded in an insulator     │
│  material disposed on a front surface of the    │
│         semiconductor substrate 520             │
└─────────────────────────────────────────────────┘
```

FIG. 5

INTEGRATED PASSIVE DEVICE AND FABRICATION METHOD USING A LAST THROUGH-SUBSTRATE VIA

RELATED APPLICATIONS

This application is a divisional of U.S. patent application Ser. No. 15/813,710, entitled, "Integrated Passive Device and Fabrication Method Using a Last Through-Substrate Via," filed Nov. 15, 2017, which claims priority to and the benefit of U.S. Provisional Application No. 62/549,206, entitled, "Via Last TSV Development for IPD," filed on Aug. 23, 2017, these applications are incorporated by reference herein in their entireties.

TECHNICAL FIELD

The present disclosure relates to relates to semiconductor devices and, in particular, to integrated passive devices (IPD).

BACKGROUND

Modern electronic devices (e.g., transistors) and circuits are fabricated as integrated circuits (ICs) on semiconductor substrates. In electronic circuit packages, the ICs are mounted on circuit boards. The electronic circuit packages can further include discrete passive components such as capacitors, inductors, and resistors mounted on the circuit boards to make complete operational electronic circuits. In many instances, the passive components (such as capacitors, inductors, and resistors components) can be fabricated as integrated passive devices (IPDs) on the semiconductor substrates. The IPDs can have reduced size, increased density, or superior electrical properties compared to, for example, standalone discrete passive components used in electronic circuit packages. The IPDs are used, for example, as low cost, low profile radio frequency (RF) components (e.g., capacitors, and inductors to match cellphone port adapters (PAs)) and interconnects in consumer products like cell phones and other wireless devices. The IPDs can be used as a RF substrate to match other die in RF electronics.

SUMMARY

In one general aspect, a method includes grinding a backside of a substrate to reduce a thickness of a central portion of the semiconductor substrate while leaving a mechanical support ring on an outer portion of the substrate, and forming a through-substrate via (TSV) from the backside of the substrate. The TSV defines interconnect access to at least one passive component embedded in an insulator material disposed on a front surface of the substrate.

In another general aspect, a method includes embedding at least one passive device in an insulator material disposed on a front surface of an inactive supporting substrate. The passive device having a device body between two device terminals. The method further includes forming a through-substrate via (TSV) extending from a backside of the substrate through the front surface of the substrate in to an insulator material cavity that exposes a device terminal in the insulator material, the exposed device terminal connected to the device body that is embedded in the insulator material. The TSV defines interconnect access to the at least one passive device having the device body that is embedded in the insulator material disposed on the front surface of the substrate. The TSV is a tapered TSV having a tapered wall sloping in from a wider surface opening of the TSV to a narrower opening at the front surface of the substrate, the substrate portion of the TSV having a width at the front surface of the substrate wider than a width of the insulator material portion of the TSV at the front surface of the substrate.

In a further aspect, the method includes disposing a copper layer on the backside of the substrate and in the TSV. The copper layer defines an electrical connection through the TSV to the exposed device terminal in the device body that is embedded in the insulator material.

BRIEF DESCRIPTION OF THE DRAWINGS

FIG. 5 is a flowchart that illustrates a method of making the devices described herein.

Like reference characters or numerals represent like elements throughout the various drawings.

DETAILED DESCRIPTION

Figure 1A:
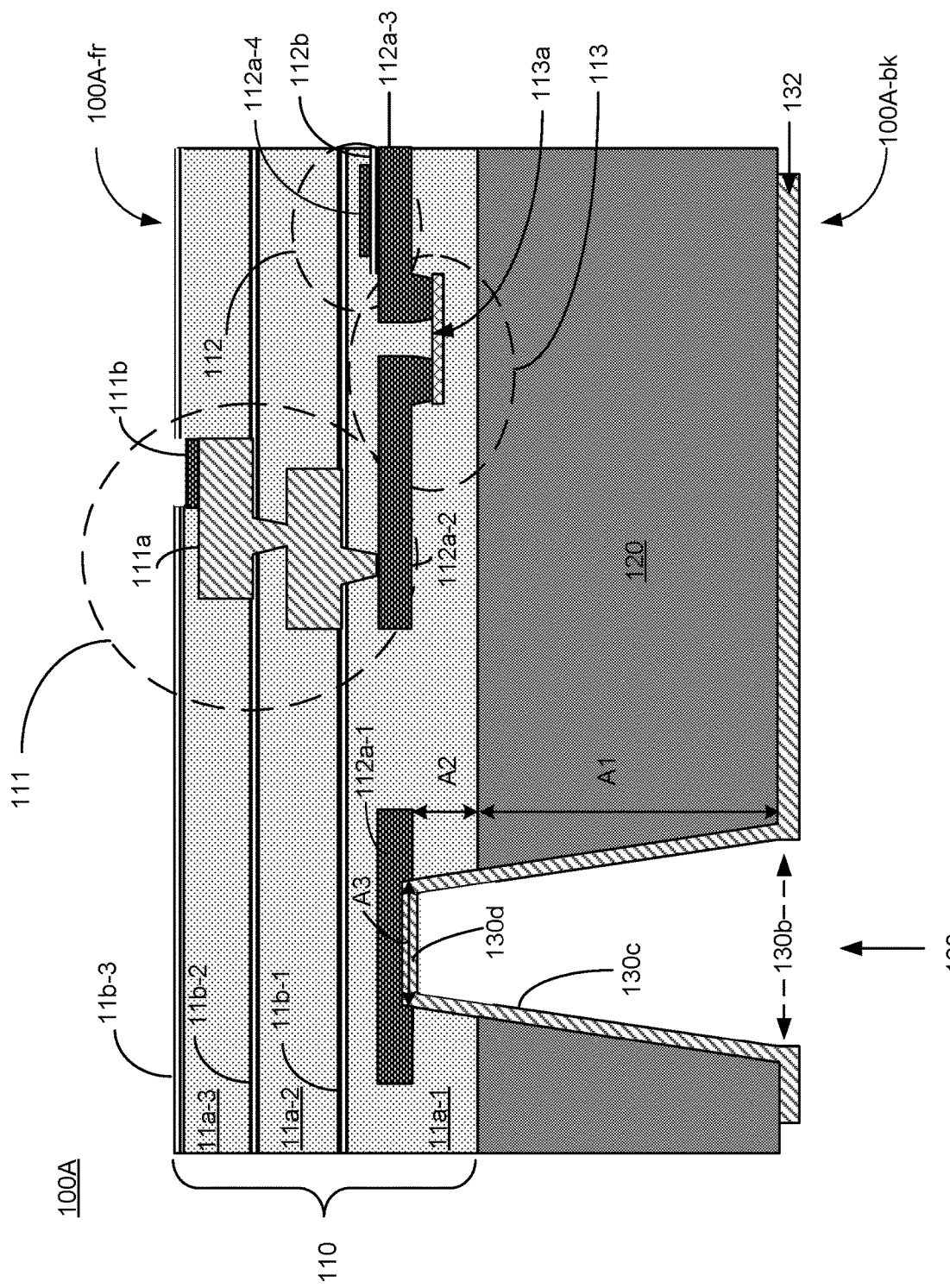
FIG. 1A is an illustration of an example integrated passive device (IPD), in accordance with the principles of the present disclosure.

An integrated passive device (IPD), which includes one or more passive components (e.g., components such as capacitors, inductors, or resistors) supported on a semiconductor substrate, can be fabricated using a semiconductor device fabrication processes. The semiconductor device fabrication processes may be similar to the processes used to create the integrated circuits that are present in everyday electrical and electronic devices. The semiconductor device fabrication processes may include a multiple-step sequence of photo lithographic and chemical processing steps during which electronic circuits are created layer-by-layer on a substrate made of semiconducting material. Front end processes for material patterning, deposition, removal, etc. can be used to embed active components (e.g., metal-oxide-semiconductor field effect transistors) MOSFETs, bipolar junction transistors (BJTs), diodes) and passive components (e.g., capacitors, inductors, or resistors) of the integrated passive devices (IPD) in insulator material on a semiconductor substrate. Metallization processes can be used for electrical connection to the active components and/or passive components embedded in the insulator material on the semiconductor substrate of the IPD.

Using the semiconductor device fabrication processes, the passive components, in particular, of the IPD can be formed by layers of materials with different electrical properties. The layers can be formed on, or in, the semiconductor substrate by a variety of deposition techniques. For example, thin film deposition may involve chemical vapor deposition (CVD), physical vapor deposition (PVD), electrolytic plating, and electroless plating processes. Each layer may be patterned to form portions of the passive components, or electrical connections between components in the IPD.

The layers can be patterned using photolithography, which involves the deposition of light sensitive material (e.g., a photoresist) over the layer to be patterned. A pattern can be transferred from a photomask to the photoresist using light. The portion of the photoresist pattern subjected to light can be removed using a solvent, exposing portions of the underlying layer to be patterned. The remainder of the photoresist can be removed to leave behind a patterned layer. Alternatively, some layers can be patterned by directly depositing material into the areas or voids formed by a previous deposition/etch process using techniques such as electrolytic or electroless plating.

Depositing a thin film of material over an existing pattern can exaggerate the underlying pattern and create a non-uniformly flat surface. A uniformly flat surface may be required to produce smaller and more densely packed device components. Planarization can be used to remove material from the surface of the wafer and produce a uniformly flat surface. Planarization involves polishing the surface of the wafer with a polishing pad. An abrasive material and corrosive chemical are added to the surface of the wafer during polishing.

Through-substrate vias (TSVs) (also can be referred to as a through-chip vias or as through-silicon vias if a silicon substrate is used), which are etched into the semiconductor substrate, can provide vertical interconnect access for electrical connection to the passive components embedded in insulator material on the semiconductor substrate of the IPD.

In accordance with the principles of the present disclosure, electrical connections to the passive components embedded in the insulator material on the semiconductor substrate of an IPD can be made using last via TSVs that are etched in the backside of semiconductor substrate after the passive components have been fabricated in the insulator material on the frontside (which can include a front surface) of the semiconductor substrate.

FIG. 1A shows a portion of an example structure of an IPD 100A in which electrical connections to the passive components are made by a through-substrate via (TSV) from the backside side of the semiconductor substrate, in accordance with the principles of the present disclosure.

IPD 100A may, for example, include IPD insulator layers 110 supported on a semiconductor substrate 120 (also can be referred to as a substrate) (e.g., a thinned silicon wafer). Substrate 120 can have a frontside (e.g., frontside 100A-fr) and a backside (e.g., backside 100A-bk). IPD insulator layers 110 may be supported on the frontside (e.g., frontside 100A-fr) of substrate 120. IPD insulator layers 110 may include a stack of different insulator layers (e.g., silicon dioxide layers 11a-1, 11a-2, 11a-3, etc., and silicon nitride layers (SiN) 11b-1, 11b-2, 11b-3, etc.) in which the passive components (e.g., an inductor structure 111, a capacitor structure 112, and a resistor structure 113) are either fully or at least partially embedded. Each of IPD insulator layers 110 may have a thickness of about 10 μm or less. The semiconductor substrate 120 (e.g., a thinned silicon wafer) on which IPD insulator layers 110 are supported may have a thickness A1 of about 200 μm or less (e.g., 150 μm) (which can be three-quarters or less (e.g., half, one-quarter) of an original thickness of the substrate 120). In some implementations, substrate 120 may be a high-resistivity silicon wafer. A distance A2 between the substrate and a terminal 112a-1 of IPD 100A embedded in IPD insulator layers 110 can be approximately 5-10 microns (e.g., 5.6 μm).

In IPD 100A, inductor structure 111 may, for example, include an inductive wire or line structure 111a disposed between a surface bond pad 111b and a terminal 112a-2. Capacitor structure 112 may, for example, include a capacitor gap material pad 112b disposed between a gate terminal 112a-4 and a terminal 112a-3. Resistor structure 113a may, for example, include a resistive material pad 113a disposed between terminal 112a-2 and terminal 112a-3. In the foregoing passive components, conductive elements (e.g., inductive wire or line structure 111a, surface bond pad 111b, terminal 112a-1, terminal 112a-2, terminal 112a-3, terminal 112a-4, etc.) may be made of conductive materials (e.g., copper, and or aluminum, etc.). For example, component terminals (e.g., terminal 112a-2, terminal 112a-3, terminal 112a-4, etc., may be made of aluminum, and inductive wire or line structure 111a may be made of copper. Capacitor gap material pad 112b may be made of a dielectric material (e.g., silicon dioxide, hafnium oxide, undoped polysilicon, etc.). Resistive material pad 113a may be made of a resistive material (e.g., titanium nitride (TiN), titanium-tungsten (TiW), tantalum-nitride (TaN), polysilicon, etc.).

In the example IPD 100A shown in FIG. 1, backside access for electrical connection terminals (e.g., terminal 112a) to the embedded passive components (e.g., inductor structure 111, capacitor structure 112, or resistor structure 113) may be provided by a through-substrate via (e.g., TSV 130a) that is etched on the backside (e.g. backside 100A-bk) of substrate 120 on which the IPD insulator layers 110 are supported. TSV 130a may, for example, extend from a surface opening 130b to a TSV bottom 130d (which may expose, for example, a terminal 112a of the passive components embedded in the IPD insulator layers 110). The TSV bottom 130d can have a width A3 (e.g., a diameter) of between a few microns (e.g., 5 μm, 10 μm) and hundreds of microns (e.g., 800 μm, 1000 μm, 2000 μm). TSV 130a may have a tapered structure with surface opening 130b being wider than TSV bottom 130d, and with tapered walls 130c sloping in from wider surface opening 130b to narrower TSV bottom 130d. A copper layer 132 may be disposed on the backside (e.g., backside 100A-bk) of substrate 120, and in TSV 130a conformally along tapered walls 130c and over TSV bottom 130d. Copper layer 132 may provide electrical connection to a terminal 112a of the passive components of IPD insulator layers 110 from the backside (e.g. backside 100A-bk) of substrate 120.

The various elements (e.g., inductive conductive wire or line structure 111b, terminal 112a-1, etc.) of the passive components may be formed in IPD insulator layers 110 by layer-by-layer patterning, deposition, and removal of different materials (e.g., dielectric and insulator materials (such as silicon dioxide or silicon nitride, etc.), and conductive materials (such as copper, aluminum, polysilicon, etc.) on a semiconductor substrate by front end semiconductor device fabrication processes. The semiconductor substrate 120 may, for example, be a standard substrate (e.g., a 100 mm diameter silicon wafer with a typical thickness of 525 μm, or a 300 mm diameter silicon wafer with a typical thickness of 775 μm, etc.). After IPD insulator layers 110 in which the embedded IPD components are formed, the semiconductor substrate 120 may be thinned down to a thickness of about 200 μm or less (e.g., 150 μm). Further, through-substrate vias (e.g., TSV 130a) may be etched in substrate 120 (e.g., thinned silicon wafer) from the backside (e.g., backside 100A-bk) for vertical interconnection access to the passive components 111, 112, 113 embedded in IPD layers 110 that are formed on the frontside (e.g., frontside 100A-fr) of substrate 120. A vertical interconnection to the passive components embedded in the IPD layers 110 may be made using a conductive material (e.g., copper layer 132).

While the example IPD 100A of FIG. 1 is described using a silicon wafer as an example semiconductor substrate 120 in which the last via TSV 130a is etched from the backside, other IPDs may use other kinds of substrates (e.g. a glass, an aluminum oxide ($Al_2O_3$), or a beryllium oxide (BeO) substrate) in which last via TSVs (e.g., last via TSV 130a) can be etched from the backside for vertical interconnection access to the passive components 111, 112, 113 embedded in frontside IPD layers 110.

Figure 1B:
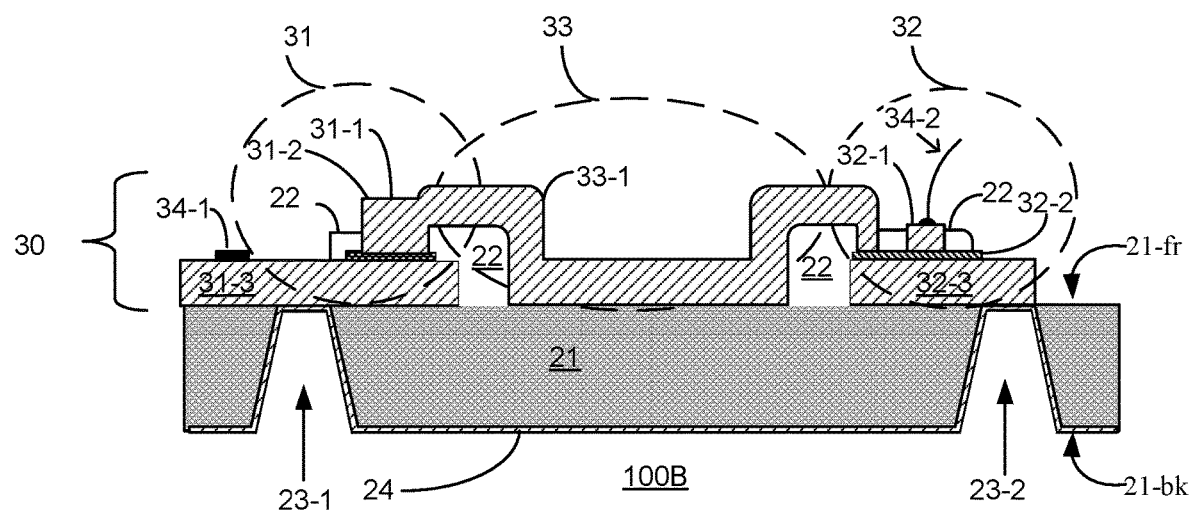
FIGS. 1B and 1C are illustrations of example integrated passive device (IPD) die, in accordance with the principles of the present disclosure.
Figure 1C:
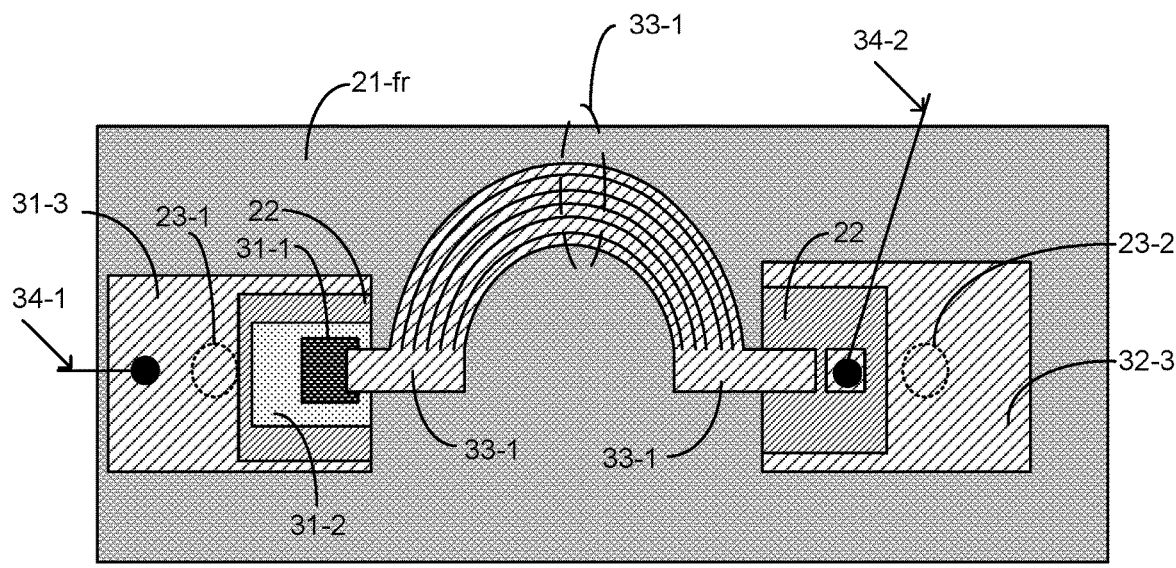

FIGS. 1B and 1C show an example integrated passive device (IPD) die 100B with last via through-substrate vias (TSVs) for interconnect access to device components, in accordance with the principles of the present disclosure. IPD die 100B may, for example, include, a tunable radio frequency (RF) circuit 30 disposed on a substrate 21 (e.g., a glass substrate). Substrate 21 may have a frontside (e.g., frontside 21-fr) and a backside (e.g., backside 21-bk). As shown in a cross-sectional view in FIG. 1B, and in a top plan view in FIG. 1C, the passive components of RF circuit 30 that are disposed on the frontside of substrate 21 may, for example, include a resistor 31, a capacitor 32, and an inductor 33. The passive components may be at least partially embedded in an insulator layer 22 (e.g., a silicon dioxide layer) disposed on the frontside of the substrate.

Resistor 31 may include a resistive material layer 31-2 (e.g., a silicon nitride (SiN) or other high K material layer) disposed between a terminal 31-1 and a conductive pad 31-3). Terminal 31-1 and a conductive pad 31-3 may be made of metal (e.g., copper). Capacitor 32, which may be a tunable capacitor, may include a capacitive gap material 32-2 disposed between a terminal 32-1 and a conductive pad 32-3. The capacitive gap material 32-2 may, for example, be a thin film of barium strontium titanate (BST). Terminal 32-1 and conductive pad 32-3 may be made of metal (e.g., copper or aluminum). Inductor 33 may include a wire or coil structure 33-1 connected to a conductive pad 33-2. Wire or coil structure 33-1 and conductive pad 33-2 may be made of metal (e.g., copper). Wire or coil structure 33-1 may be connected to resistor terminal 31-1 and capacitor conductive pad 32-3 to form circuit 30. Circuit 30 may also include frontside wire bond 34-1 bonded to resistor conductive pad 31-3 and frontside wire bond 34-2 bonded to capacitor terminal 32-1 for frontside electrical connection to circuit 30. Wire bond 25-1 and wire bond 25-2 may, for example, be gold wire bonds.

Conductive pads 31-3, 32-3 and 33-2 that are disposed on frontside 21-fr of substrate 21 may also serve as circuit terminals of circuit 30. In the example IPD die 100B shown in FIGS. 1B and 1C, tapered TSVs (e.g., TSV 23-1 and TSV-23-2) that are etched through substrate 20 provide backside interconnect access to the circuit terminals (e.g., conductive pad 31-2 and conductive pad 32-3, respectively,) of circuit 30, in accordance with the principles of the present disclosure. In the example IPD die 100B shown in FIGS. 1B and 1C, a conductive layer 24 (e.g., a copper layer) that may, for example, be plated on the backside of the substrate and in the TSVs provides electrical connection to conductive pad 31-2 and conductive pad 32-3 through the TSVs (e.g., TSV 23-1 and TSV-23-2).

Figure 2A:
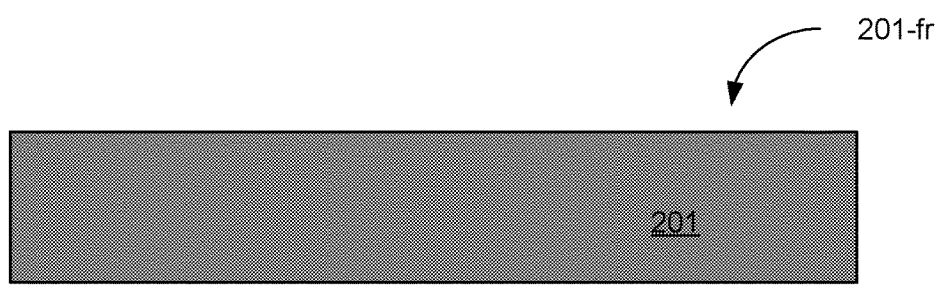
FIGS. 2A through 2S illustrate cross-sectional views of a substrate as it is being processed through multiple steps of semiconductor device fabrication process to fabricate an example IPD, in accordance with the principles of the present disclosure.

An example semiconductor device fabrication process for fabricating an example IPD is described in connection with FIGS. 2A-2S. FIGS. 2A-2S show cross-sectional views of a substrate as it is being processed through multiple steps of semiconductor device fabrication process to fabricate the example IPD (e.g., IPD 215, FIG. 2S), in accordance with the principles of the present disclosure. While like reference characters or numerals are used to label like elements throughout the various drawings, some of the elements are not labeled in some of the figures for visual clarity in views and simplicity in description.

The semiconductor device fabrication process shown in FIGS. 2A-2S may be referred to as IPD fabrication process hereinafter. The multiple steps or IPD fabrication process may, for example, involve wafer level processing of the substrate layer by layer. These steps may, for example, include photoresist coating, lithographic patterning, deposition, and removal of materials on (or of) the substrate. IPD 215 fabricated by IPD fabrication process may be in state ready for packaging.

Figure 2B:
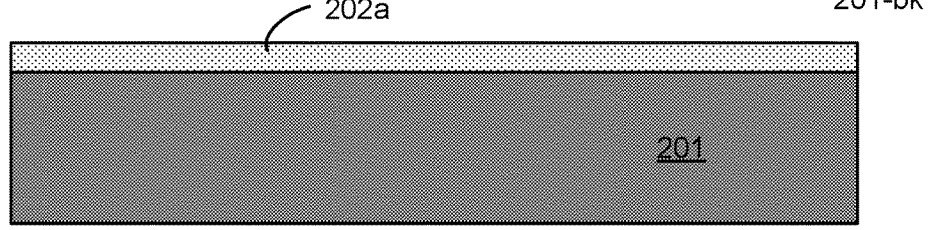

As shown in FIG. 2A, IPD fabrication process begins by selecting a semiconductor substrate (e.g., a high resistivity Si wafer 201) that has a frontside (e.g., frontside 201-fr) and a backside (e.g., backside 201-bk), and, in FIG. 2B, forming a first insulator layer 202a on the frontside (e.g., frontside 201-fr) of the semiconductor substrate. The first insulator layer may, for example, be made of any of silicon dioxide (SiO2), silicon nitride (SiN), and or silicon oxynitride (SiON) materials, or a combination thereof. The semiconductor substrate may, for example, be 51 mm diameter substrate that is about 275 µm thick, a 76 mm diameter substrate that is about 375 µm thick, a 125 mm substrate that is about 625 µm thick, a 150 mm diameter substrate that is about 675 µm thick, a 200 mm diameter substrate that is about 725 µm thick, or a 300 mm diameter substrate that is about 775 µm thick.

Figure 2C:
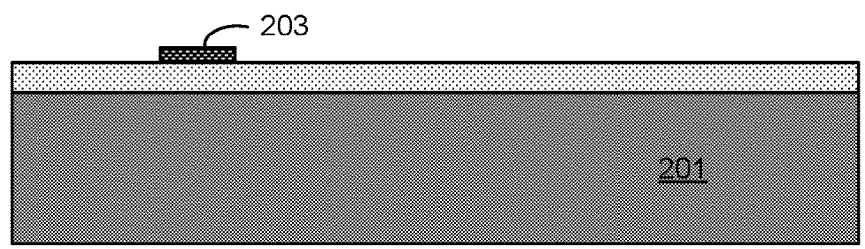
Figure 2D:
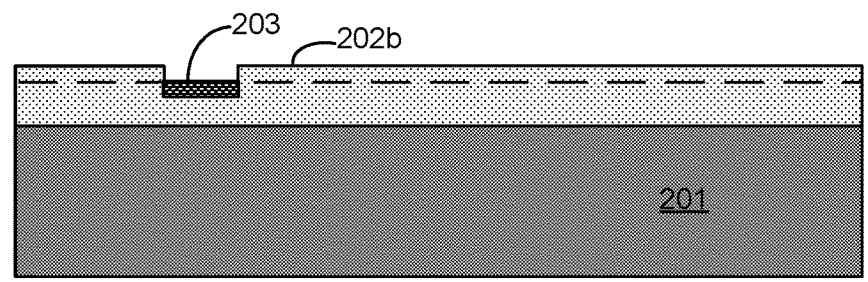
Figure 2E:
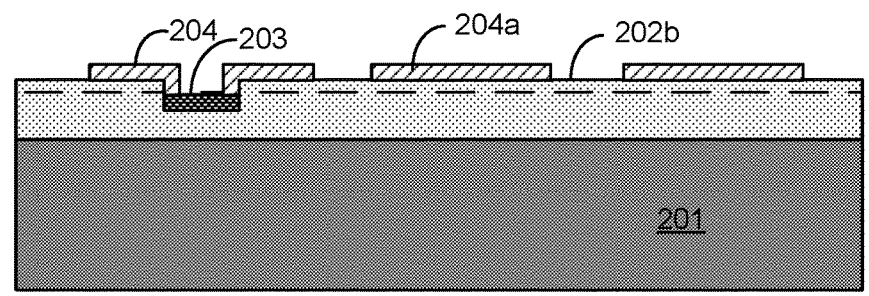

IPD fabrication process may further include forming a patterned resistive layer 203 for a resistor on first insulator layer 202a shown in FIG. 2C; forming a patterned second insulator layer 202b shown in FIG. 2D; and, forming a patterned first metal layer 204a thereon shown in FIG. 2E. Patterned resistive layer 203 may, for example, be made of any of TiN, TiW, TaN, a polysilicon material, or a combination thereof. Patterned second insulator layer 202b, like first insulator layer 202a, may be made of any of SiO2, SiN, and SiON materials or a combination thereof. Patterned first metal layer 204a be made of any of any metallic material (e.g., aluminum (A1), copper (CU), metal alloys, etc.). Patterned first metal layer 204a may include terminals (e.g., like terminal 112a-1, IPD 100A) of the passive components embedded in IPD 215 (FIG. 2S).

FIG. 2E shows, in schematic cross-sectional view, a structure of substrate 201 after it has been processed as shown in FIG. 2E of the IPD fabrication process.

Figure 2F:
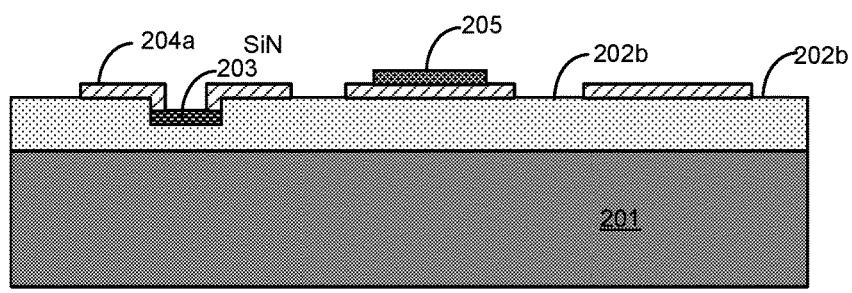

As shown in FIG. 2F, IPD fabrication process may further include forming a patterned gap layer 205 for a capacitor. The patterned gap layer for the capacitor may be made of SiN, tantalum oxide (TaO), hafnium (HfO) materials or a combination thereof.

Figure 2G:
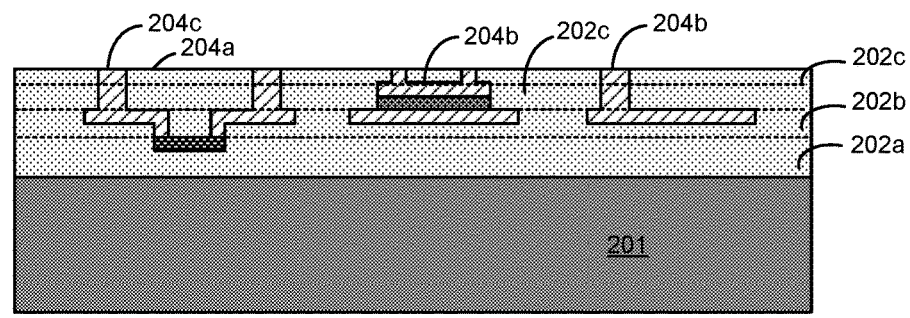

Further, as shown in FIG. 2G, IPD fabrication process may further include forming patterned second metal layer 204b for a capacitor electrode; forming a patterned third insulator layer 202c; and forming a patterned third metal layer 204c. Patterned second metal layer 204b and patterned third metal layer 204c, like the patterned first metal layer, may be, for example, made of A1, Cu, AlCu, AlSi and AlSiCu materials or a combination thereof. The patterned third insulator layer, like the first and second insulator layers, may, for example, be made of SiO2, SiN, and SiON materials or a combination thereof.

Figure 2H:
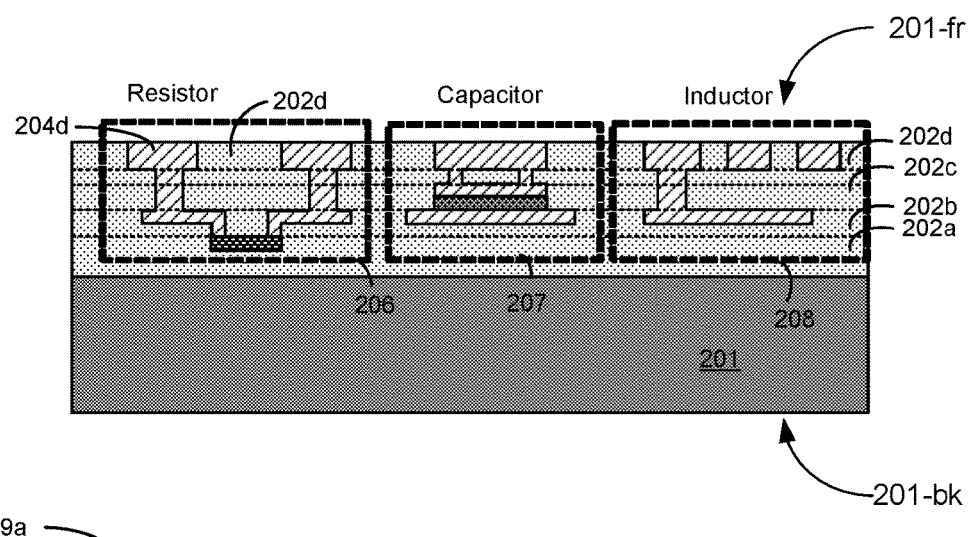

As shown in FIG. 2H, IPD fabrication process may further include forming a patterned fourth insulator layer 202d; and forming a patterned fourth metal layer 204d for contact. The patterned fourth metal layer, like the patterned third metal layer, may, for example, be made of Cu, A1, AlCu, AlSi, AlSiCu materials or a combination thereof. The patterned fourth insulator layer, like the first, second, and third insulator layers, may be made of SiO2, SiN, and SiON materials or a combination thereof.

At this stage of IPD fabrication process, using frontend wafer level processing (e.g., as shown in FIGS. 2A through 2H) there may be a complete formation of embedded passive components: a resistor 206, a capacitor 207 and an inductor 208 of IPD 215. FIG. 2H shows, in schematic cross-sectional view, a structure of the frontend processed substrate of the IPD process. The frontend processed structure includes the passive components the resistor structure 206, the capacitor structure 207, and the inductor structure 208 embedded in insulator layers 202a-202d atop the frontside (e.g., frontside 201-fr) of substrate 201. For convenience in description herein, the frontend processed structure may be referred to herein as the semi processed IPD device.

In the semi processed IPD device, resistor structure 206 includes patterned resistive layer 203 for a resistor previously formed on first insulator layer 202a. Patterned resistive layer 203 may be electrically connected by terminals made of the subsequent formations of patterned first metal layer 204a, patterned second metal layer 204b, patterned third metal 204c, and patterned fourth metal layer 204d in the IPD fabrication process (FIGS. 2F, 2G, and 2H). Capacitor 207 includes gap layer 205 previously patterned on first metal layer 204a (FIG. 2F) and a terminal made of subsequent formations of patterned second metal layer 204b, patterned third metal 204c, and patterned fourth metal layer 204d in the IPD fabrication process (FIGS. 2G and 2H). Inductor structure 208 includes patterned wire of coil structures made of formations of patterned metal layers 204a, 204b, 204c, and 204d in the IPD fabrication process (FIGS. 2F, 2G, and 2H).

Figure 2I:
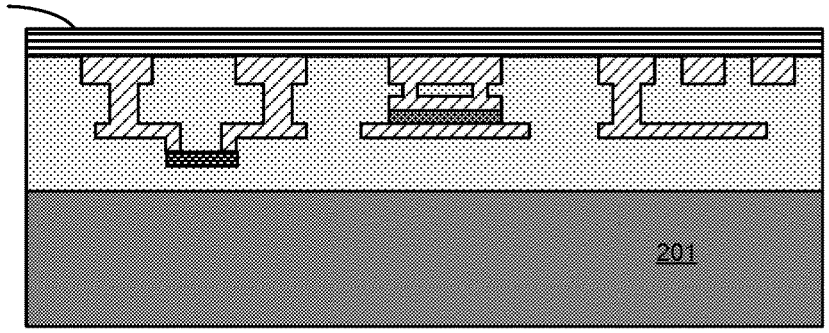

Further steps in IPD fabrication process (e.g., FIGS. 2I through 2S) may involve backend or backside processing of the frontend processed substrate 201. IPD fabrication process may include a tape mount process to apply a protective tape 209a to a frontside (e.g., a front surface) of frontend processed substrate 201. FIG. 2I shows, for example, tape 209a coupled to (e.g., mounted on) a front surface of the frontend processed substrate 201.

Figure 2J:
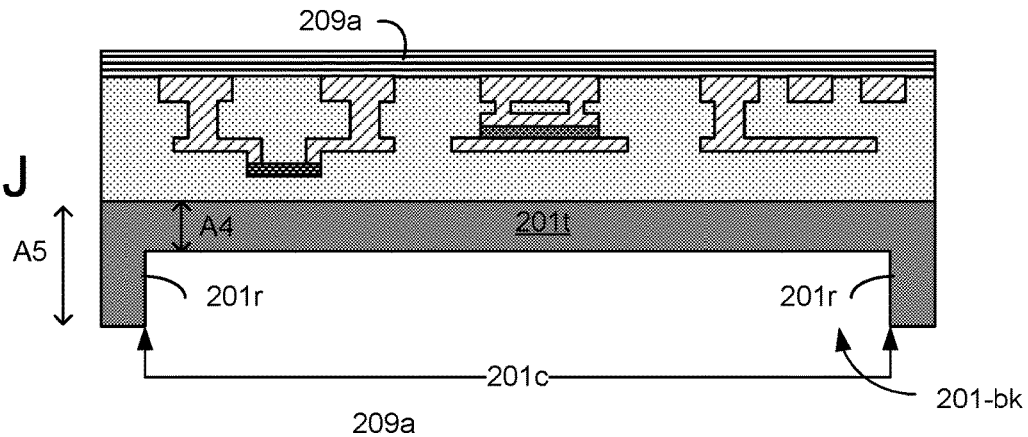

Further steps in IPD fabrication process, as shown in FIG. 2J, may involve back grinding the frontend processed substrate 201 to thin a central portion 201c of substrate 201 (shown as thinned substrate 201t) for backside development while retaining a mechanical support ring 201r on the outer circumference of substrate 201; and wet etching or polishing to smooth the ground surfaces. A grind process (e.g., a TAIKO grind process) may be used to back grind substrate 201 and form mechanical support ring 201r. The grind process can thin grind only the central portion 201c of the substrate from the backside (e.g., backside 201-bk) while leaving a frame or support ring (approximately 3 mm wide) in a ring section on the substrate's outer edge. The thickness A4 of central portion 201c of thinned substrate 201t may, for example, be 5 µm to 200 µm in thickness, while the thickness A5 of an approximately 3-mm wide mechanical support ring 201r may, for example, be about 200 to 800 µm (i.e., about the same as the starting substrate thickness (shown in FIGS. 2A-2I)). Accordingly, the ratio of the thickness A4 of the thinned portion to the thickness A5 of the support ring 201r can be between 160:1 to 1:1. Having mechanical support ring 201r on the outer circumference of substrate improves wafer strength, and may lower substrate warpage and edge chipping that may occur during further processing of thinned substrate 201t.

Figure 2K:
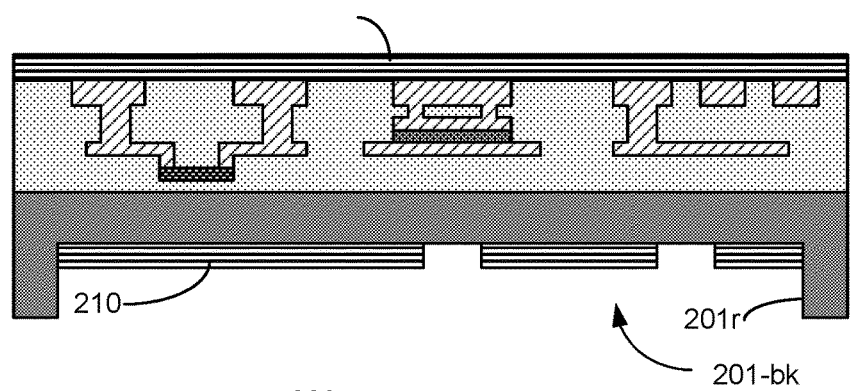

As shown in FIG. 2K, IPD fabrication process may further include forming a patterned photoresist layer 210 (e.g., a copper photoresist) on the backside (e.g., backside 201-bk) of thinned substrate 201t (e.g., in preparation for forming through-substrate vias (TSVs) through openings in the backside photoresist layer 210).

Figure 2L:
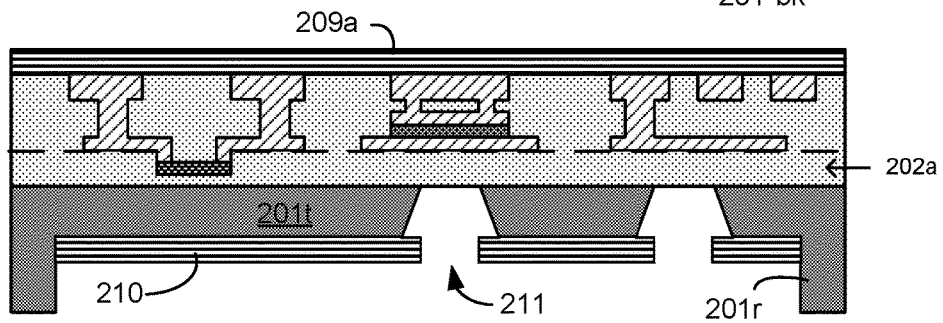

IPD fabrication process for forming a through-substrate via (TSV) may include as shown at FIG. 2L, using a silicon dry etch to etch a TSV 211 into the substrate through the pattern openings in the photoresist 216.

FIG. 2L shows, in schematic cross-sectional view, a structure of the processed substrate after the through etched TSV 211 is formed. As shown in FIG. 2L, the silicon dry etched TSV (e.g., TSV 211) in thinned substrate may be a tapered TSV extending from the backside surface of thinned substrate 201t, through the thickness of the substrate, to about a frontside interface of substrate 201t with the first metal layer (e.g., metal layer 204a).

Figure 2M:
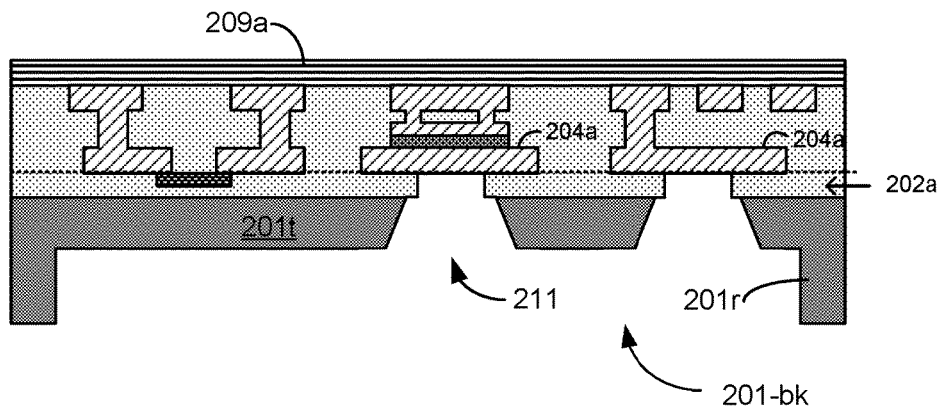

As shown in FIG. 2M, IPD fabrication process may further involve removing the patterned photo resist on the backside (e.g., backside 201-bk) of the thinned substrate; and using a SiO$_2$ etch (at the bottom of TSV 211) to form openings in the first insulator layer (e.g., insulator layer 201a) to expose a surface of the first metal layer (e.g., metal layer 204a) through TSV 211. The SiO2 etch may involve dry etching or wet etching the first insulator layer (e.g., insulator layer 201a) through TSV 211. FIG. 2M shows, in schematic cross-sectional view, a structure of the processed substrate after the SiO$_2$ etching in IPD fabrication process.

Figure 2N:
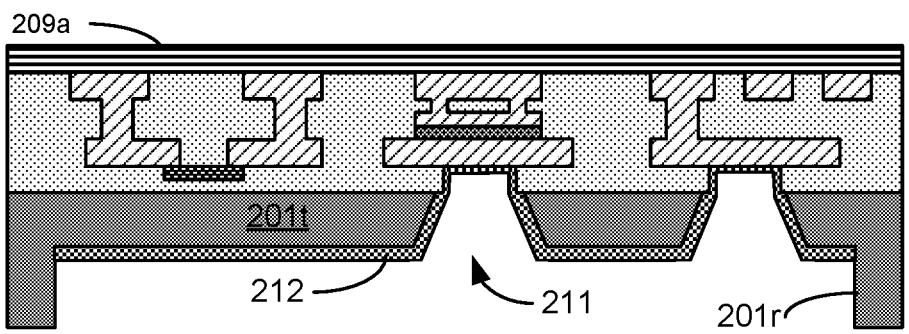

As shown in FIG. 2N, IPD fabrication process may further include a silicon dry etch to additionally etch back or clean silicon surfaces; and depositing a titanium/copper barrier or seed layer 212 on the exposed surfaces of substrate 201t and on the exposed silicon surfaces of TSV 211. The titanium/copper barrier or seed layer 212 may be deposited, for example, by a sputtering process.

Figure 2O:
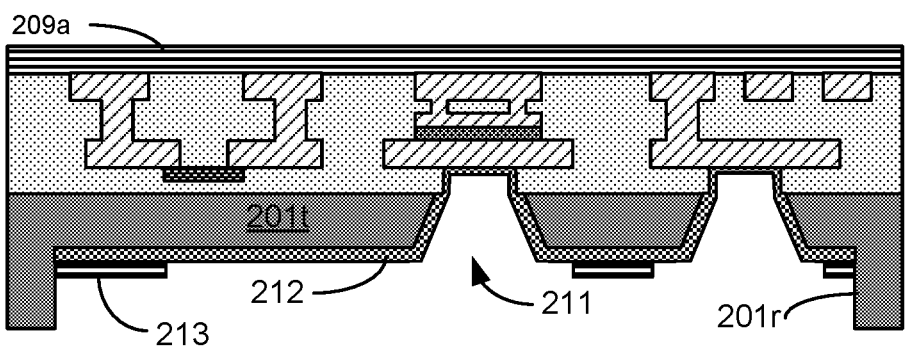
Figure 2P:
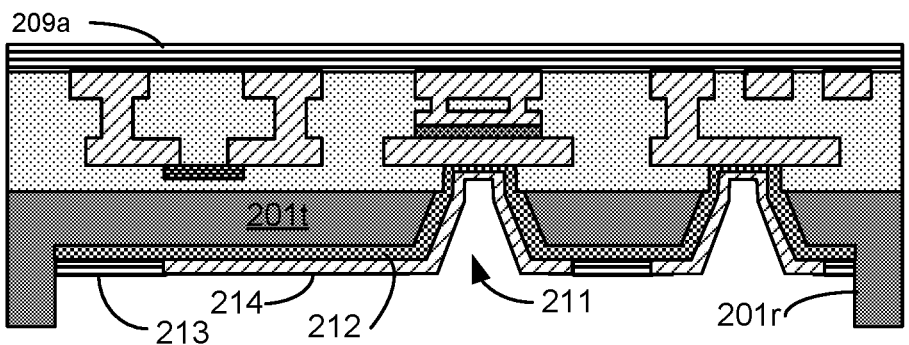

Next, as shown in FIG. 2O IPD fabrication process may further include forming a patterned photoresist layer 213 on titanium/copper barrier or seed layer 212; and as shown in FIG. 2P, depositing a copper layer 214 on the backside substrate surface and in TSV 211. Depositing copper layer 214 may involve electrolytic or electroless copper plating processes.

Figure 2Q:
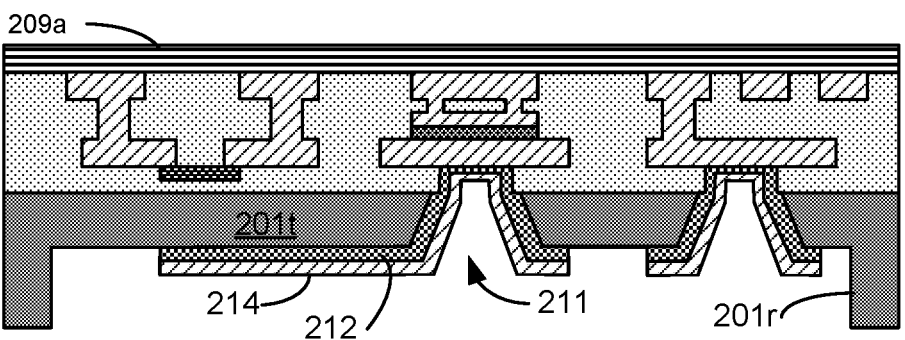

Next, as shown in FIG. 2Q, IPD fabrication process may further include removing patterned photoresist 213; and preparing the surface of copper layer 214 for wafer level packaging (e.g., for flip chip bump and assembly). Preparing the surface of copper layer 214 may include applying an under bump metal (UBM) etch (e.g., a titanium (Ti) and titanium tungsten (TiW) etch) to copper layer 214.

Figure 2R:
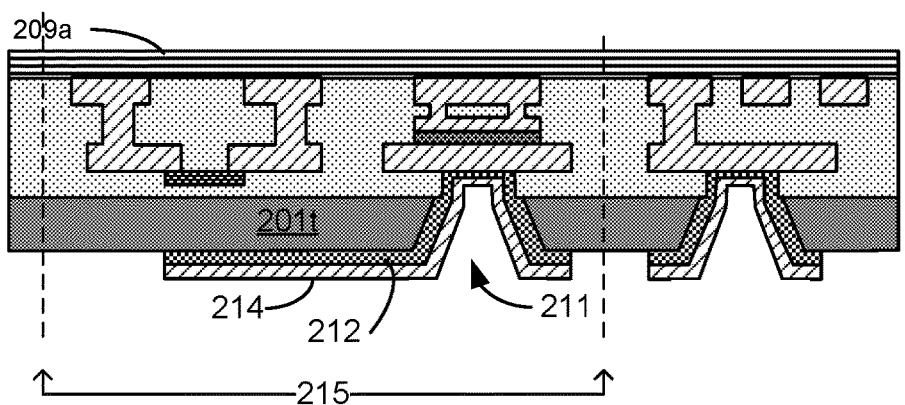
Figure 2S:
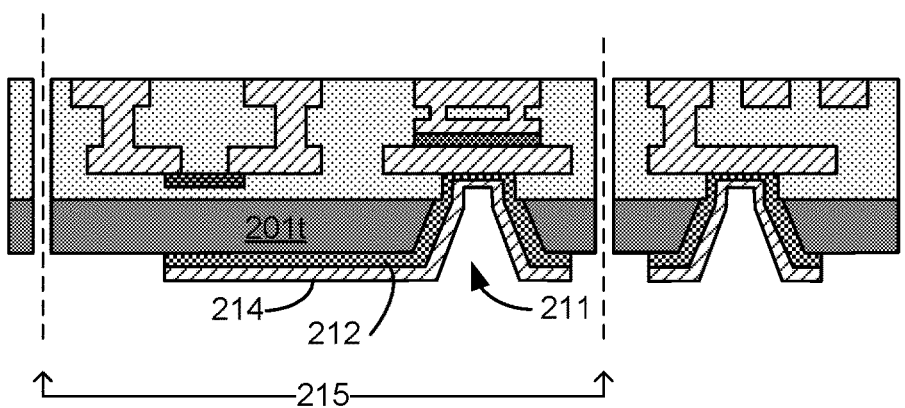

IPD fabrication process may further include as shown in FIG. 2R a tape remove and tape mount process, for example, to replace protective tape 209a with a grind process tape 209b); and removing mechanical support ring 201r (e.g., by back grinding to a reduced height). Removing mechanical support ring 201r may, for example, use a ring grinding process (e.g., a TAIKO ring grinding process). The ring grinding process can back grind mechanical support ring 201r so that a height difference between the ring section (i.e., the wafer outer edge) and the central portion of thinned substrate 201t is reduced. The height difference may be reduced, for example, to allow affixing of the processed substrate to a chip dicing tape and a higher quality of dicing in further steps of IPD fabrication process 200. FIG. 2R shows, in schematic cross-sectional view, a structure of the processed substrate (with the mechanical support ring 201r ground away) the ring grinding process of IPD fabrication process.

As shown in FIG. 2S, IPD fabrication process may further include a tape mount process for affixing a dicing tape (not shown) to the processed substrate; and dicing chips or die (e.g. IPD 215) from the processed substrate.

Diced chips or die of the processed substrate may be picked from the dicing tape and used as individual IPD chips or die in electronic circuit packages.

In example implementation of an electronic circuit package, a diced IPD chip or die (e.g., IPD 100A, IPD 215) may be coupled to (e.g., mounted on) a conductive pad (e.g., a ground pad) of a printed circuit board interconnected with other components in the electronic circuit package, in accordance with principles of the present disclosure.

Figure 3:
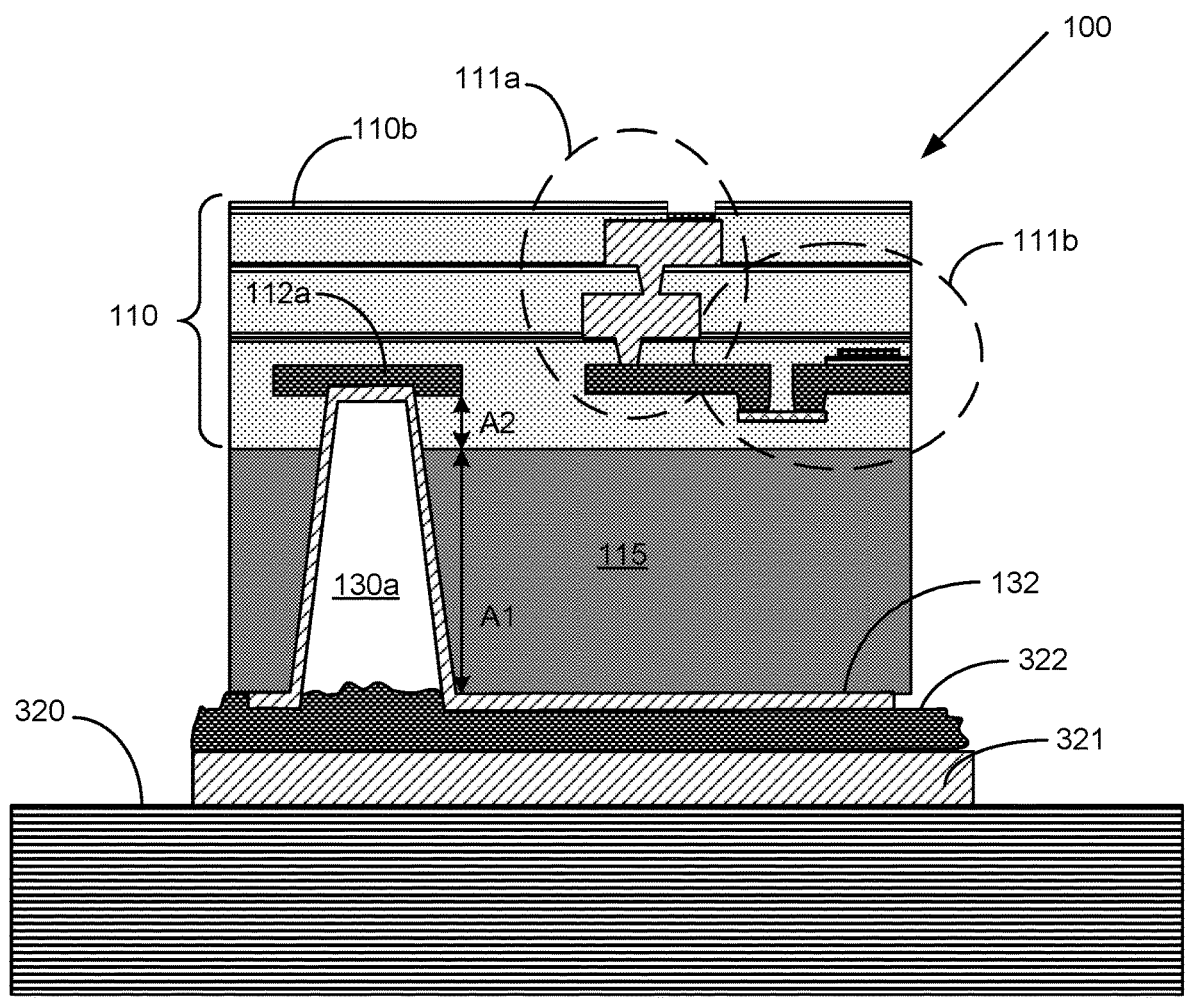
FIG. 3 is an illustration of an example IPD coupled to a circuit board, in accordance with the principles of the present disclosure.

FIG. 3 shows, for example, an electronic circuit packaging implementation in which an IPD (e.g., IPD 100A) is coupled to (e.g., mounted on) a ground pad (e.g., copper pad 321) of a printed circuit board 320. In the example shown in FIG. 3, IPD 100A may, for example, be coupled (e.g., mounted), using a conductive epoxy 322 for electrical contact between the ground pad 321 and copper layer 132 on the backside of IPD 100. Copper layer 132 (which contacts device terminals 112a, e.g., through TSV 103a of IPD 100A) may provide stable electrical contact between one or more passive components (e.g., inductor structure 111, capacitor structure 112, and resistor structure 113) embedded in IPD 100A and other components (not shown) in the electronic circuit package.

In some electronic circuit packaging implementations, an IPD (e.g., IPD 100A) may be interconnected with other components in an electronic circuit package using wafer bumping technology. The wafer bumping technology may involve use of solder applied in the form of bumps or balls to the IPD device at a wafer level. The solder bumps may be bonded between an active surface (e.g., copper layer 132) of an IPD die (e.g., IPD 100A) and a top surface of a printed circuit board or any type of substrate carrier in the electronic circuit package.

Figure 4A:
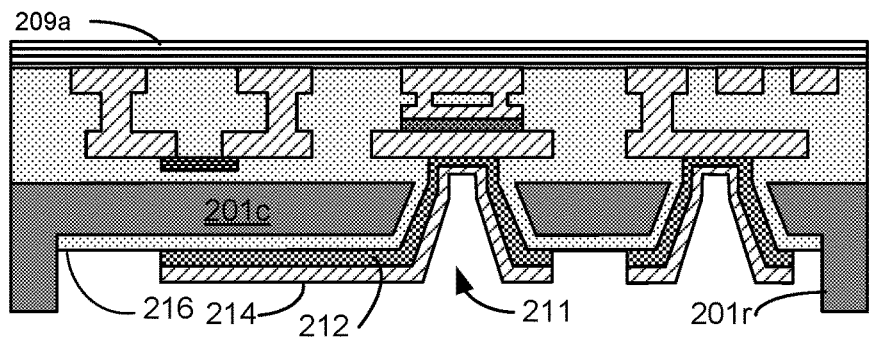
FIGS. 4A through 4C illustrate cross-sectional views of a variation of the process described in connection with at least FIGS. 2A through 2S, in accordance with the principles of the present disclosure.

IPD fabrication process shown in FIGS. 2A-2S may include additional or alternate steps to prepare IPDs in a state ready for electronic circuit packaging implementations that use wafer bumping. For example, a modified IPD fabrication process may include some of the processing variations shown in FIGS. 4A through 4C. As shown in FIG. 4A (e.g., before the photoresist removal or before the dry etch described in connection with FIG. 2M), growing an oxide layer 216 on exposed surfaces of substrate 201t.

FIG. 4A shows, in schematic cross-sectional view, a structure of the processed substrate after copper plating and photoresist removal (described in connection with FIG. 2Q) in the case oxide layer 216 is grown using modified IPD fabrication process. As shown in FIG. 4A, oxide layer 216 may lie between the surface of substrate 201t and titanium/copper barrier or seed layer 212 that is sputter deposited (described in connection with FIG. 2N).

Further, modified IPD fabrication process may further include forming a solder resist layer 217 and forming (e.g., dropping) a wafer bump or ball 218. The wafer bump or ball 218 may be made from solder material that is used in the wafer bumping technology for electronic circuit packaging, and solder resist layer 217 may be made of polymer materials that are usually applied to the copper traces of a printed circuit board (PCB) for protection against oxidation and to prevent solder bridges from forming between closely spaced solder pads. The wafer bump or ball 218 may be used to solder (i.e., bond) an active surface (e.g., copper layer 132) of an IPD die (e.g., IPD 315) and a top surface of a printed circuit board or any type of substrate carrier in the electronic circuit package.

The forming the solder resist layer 217 and the forming (e.g., dropping) the wafer bump or ball of modified IPD fabrication process may be performed after preparing the surface of copper layer 214 for wafer level packaging of the IPD process (FIG. 2Q), and, in an example implementation, before removal of ring support 201r (tape removal and ring grind shown in FIG. 2R).

Figure 4B:
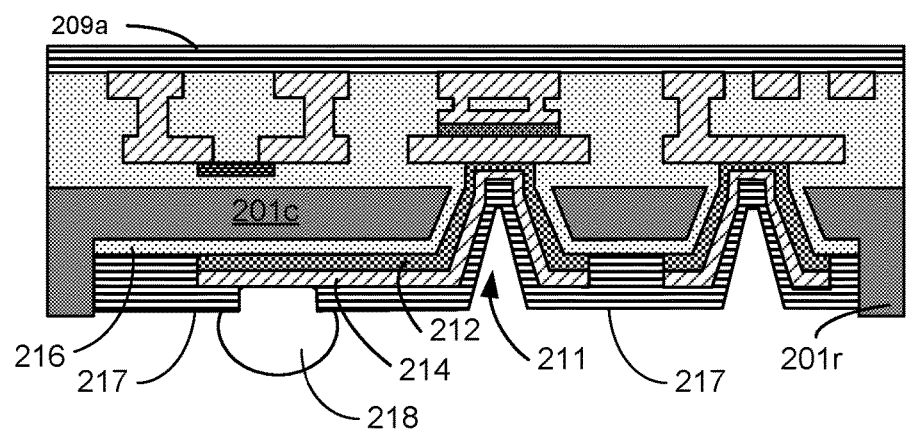

FIG. 4B shows, in schematic cross-sectional view, a structure of the processed substrate after removal of ring support 201r (tape removal and ring grind shown in FIG. 2R). FIG. 4B illustrates a modified version of the IPD fabrication process that includes forming solder resist layer 217 and forming of wafer bump or ball 218 in contact with copper layer 214.

Figure 4C:
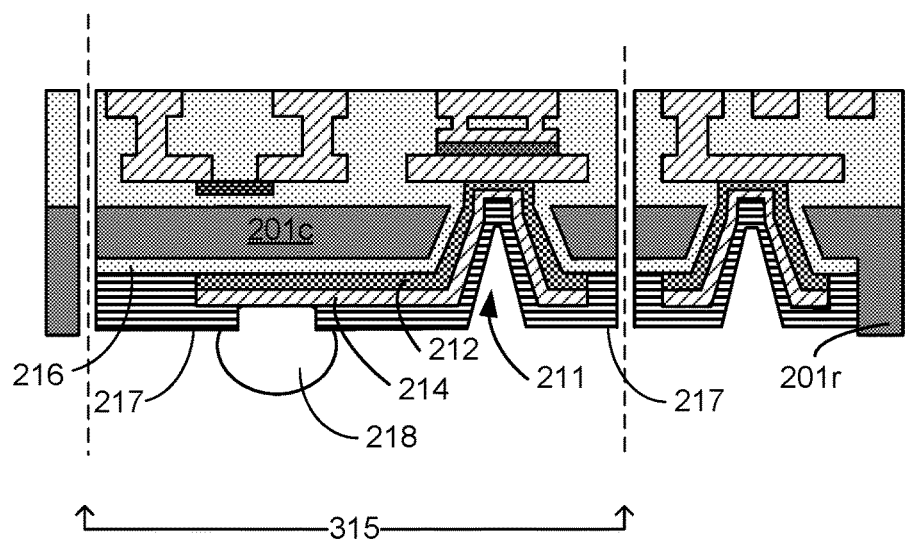

As shown in FIG. 4C, the remaining portions (e.g., shown in FIG. 4C) of IPD fabrication process may be performed in modified IPD fabrication process as before (FIG. 2S) which includes coupling (e.g., affixing) a dicing tape to the processed substrate, dicing chips or die (e.g. IPD 315) from the processed substrate, and picking the diced chips or die (e.g. IPD 315) from the dicing tape in a state ready to be used as individual IPD chips or die in electronic circuit packages using wafer bumping technology.

FIG. 5 is a flowchart that illustrates a method of making the devices described herein. As shown in FIG. 5, the method includes grinding a backside of a semiconductor substrate to reduce a thickness of a central portion of the semiconductor substrate while leaving a mechanical support ring on an outer portion of the substrate (block 510). In some implementations, the thickness can be less than 200 microns. In some implementations, the at least one passive component includes at least one of an inductor, a resistor, or a capacitor having a terminal embedded in the insulator material.

The method can also includes forming a through-substrate via (TSV) from the backside of the substrate where the TSV defines interconnect access to at least one passive component embedded in an insulator material disposed on a front surface of the semiconductor substrate (block 520).

In some implementations, the grinding the backside of the substrate includes using a grind process that thins the central portion of the substrate to be at least three-quarters or less of an original thickness. In some implementations, forming the TSV in the IPD from the backside of the substrate includes dry etching of the substrate and etching of the insulator material to expose a terminal of the at least one passive component embedded in the insulator material.

In some implementations, the method includes grinding the mechanical support ring on the outer circumference of the substrate to a reduced height. In some implementations, forming the TSV in the IPD from the backside of the substrate includes etching a tapered TSV, and the tapered TSV can have a tapered wall sloping in from a wider surface opening to a narrower TSV bottom.

In some implementations, forming the TSV in the IPD from the backside of the substrate includes plating a copper layer on the backside of the substrate and in the TSV along a tapered wall of the TSV and over a TSV bottom, the plated copper layer can define an electrical connection to the terminal of the at least one passive component embedded in the insulator material. In some implementations, plating a copper layer on the backside of the substrate and in the TSV along the tapered wall and over the TSV bottom includes depositing a titanium-copper (Ti—Cu) barrier and seed layer on the backside of the substrate and in the TSV along the tapered wall. In some implementations, the plating the copper layer on the backside of the substrate and in the TSV along the tapered wall and over the TSV bottom includes growing an oxide layer on the backside of the substrate and then plating the copper layer.

In some implementations, the method can include applying an under bump metal (UBM) etch to the copper layer. In some implementations, the method can include forming a solder resist layer, and forming a wafer bump or a ball in contact with the copper layer. In some implementations, the method can include affixing a dicing tape to the substrate, dicing the substrate into individual IPD die, and picking the individual IPD die from the dicing tape.

In at least one general aspect, an electronic circuit package can include a board having a conductive pad thereon, and an integrated passive device (IPD) die coupled to the conductive pad. The IPD die can include at least one passive component embedded in insulator material disposed on a front surface of a substrate, and a through-substrate via (TSV) extending from the backside of the semiconductor substrate toward the front surface of the substrate. The IPD die can include a copper layer disposed on the backside of the substrate and in the TSV. The copper layer can define an electrical connection from the conductive pad on the board to a terminal of the at least one passive component embedded in the insulator material through the TSV.

In some implementations, the IPD die is coupled to the conductive pad using a conductive epoxy or using a wafer bump solder. In some implementations, the substrate is one of a 51 mm diameter silicon wafer, a 76 mm diameter silicon wafer, a 125 mm silicon wafer, a 150 mm diameter silicon wafer, a 200 mm diameter silicon wafer, or a 300 mm diameter silicon wafer.

It will also be understood that when an element, such as resistor, or a capacitor, or an inductor or other IPD component, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application (if included) may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application-specific integrated circuit).

Implementations may be implemented in a computing system that includes an industrial motor driver, a solar inverter, ballast, a general-purpose half-bridge topology, an auxiliary and/or traction motor inverter driver, a switching mode power supply, an on-board charger, an uninterruptible power supply (UPS), a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

While certain features of the described implementations have been illustrated as described herein, many modifications, substitutions, changes and equivalents will now occur to those skilled in the art. It is, therefore, to be understood that claims, if appended, are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A method comprising:
    embedding at least one passive device in an insulator material disposed on a front surface of a substrate, the at least one passive device having a device body between two device terminals;
    back grinding the substrate to thin a central portion of the substrate and to form a support ring on an outer circumference of the substrate;
    forming a through-substrate via (TSV) from a backside of the substrate by dry etching through a thickness of the substrate to a TSV bottom at the front surface of the substrate and etching an opening through the TSV bottom by dry or wet etching through a portion of the insulator material to expose at least a first of the two device terminals in the insulator material,
    the TSV having a tapered wall sloping in from a wider width of the TSV at the backside of the substrate to a narrower width of the TSV bottom at the front surface of the substrate; and
    removing the support ring on the outer circumference of the substrate after forming the TSV.

2. The method of claim 1, wherein the device body includes at least one of:
    an inductive wire or line structure of an inductor, a resistive material pad of a resistor, or capacitor gap material pad of a capacitor.

3. The method of claim 1, further comprising:
    forming a copper layer on the backside of the substrate, in the TSV along the tapered wall, and in an insulator material cavity formed by the TSV, the copper layer defining an electrical connection to at least one of the two device terminals of the at least one passive device having the device body that is embedded in the insulator material.

4. The method of claim 1, wherein the forming the TSV includes a two-step etching process with a first etch to etch a substrate portion of the TSV and a second etch to etch an insulator material portion of the TSV.

5. The method of claim 1, wherein an insulator material cavity formed by the TSV extends to a depth of at least 5 μm in the insulator material from the front surface of the substrate to expose the at least one of the two device terminals to of the device body that is at least partially embedded in the insulator material.

6. A method comprising:
embedding at least one passive device in an insulator material disposed on a front surface of a substrate, the at least one passive device having a device body between two device terminals;
back grinding the substrate to thin a central portion of the substrate to form a support ring on an outer circumference of the substrate;
forming a through-substrate via (TSV) extending from a backside of the substrate toward the front surface of the substrate and extending to a depth in the insulator material disposed on the front surface of the substrate exposing at least one of the two device terminals of the device body that is embedded in the insulator material;
forming a copper layer disposed on the backside of the substrate and in the TSV, the copper layer defining an electrical connection through the TSV to at least one of the two device terminals of the device body embedded in the insulator material,
the TSV being a tapered TSV having a tapered wall sloping in from a wider surface opening of the TSV at the backside of the substrate to a narrower opening at the front surface of the substrate, a substrate portion of the TSV having a width at the front surface of the substrate wider than a width of an insulator material portion of the TSV at the front surface of the substrate; and
removing the support ring on the outer circumference of the substrate after forming the TSV.

7. The method of claim 6, further comprising:
coupling the substrate to a conductive pad, included on a board, using a conductive epoxy or using a wafer bump solder.

8. The method of claim 6, wherein an insulator material cavity extends to a depth of at least 5 μm in the insulator material from the front surface of the substrate to expose the at least one of the two device terminals connected to the device body that is at least partially embedded in the insulator material.

9. A method, comprising:
grinding a backside of a semiconductor substrate to reduce a thickness of a central portion of the semiconductor substrate to form a mechanical support ring on an outer portion of the semiconductor substrate;
etching through the semiconductor substrate using a semiconductor dry etch;
etching through a portion of an insulator material layer disposed on a front side of the semiconductor substrate using an insulator etch to form a through-substrate via (TSV) from the backside of the substrate, the TSV defining an interconnect access to at least one passive component embedded in the insulator material layer disposed on a front surface of the semiconductor substrate; and
removing the mechanical support ring on the outer portion of the substrate after using the insulator etch to form the TSV.

10. The method of claim 9, wherein the at least one passive component includes at least one of an inductor, a resistor, or a capacitor having a terminal embedded in the insulator material layer.

11. The method of claim 9, wherein the grinding the backside of the substrate includes using a grind process that thins the central portion of the substrate to be at least three-quarters or less of an original thickness.

12. The method of claim 11, wherein etching through the portion of the insulator material layer exposes a terminal of the at least one passive component embedded in the insulator material layer.

13. The method of claim 11, further comprising, grinding the mechanical support ring on the outer portion of the substrate to a reduced height.

14. The method of claim 9, wherein etching through the thickness of the semiconductor substrate and etching through the portion of the insulator material layer includes etching a tapered TSV, the tapered TSV having a tapered wall sloping in from a wider surface opening to a narrower TSV bottom.

15. The method of claim 9, further comprising:
forming a plated copper layer disposed on the backside of the substrate and in the TSV along a tapered wall of the TSV and over a TSV bottom, the plated copper layer defining an electrical connection to a terminal of the at least one passive component embedded in the insulator material layer.

16. The method of claim 15, wherein the forming the plated copper layer on the backside of the substrate and in the TSV along the tapered wall and over the TSV bottom includes depositing a titanium-copper (Ti—Cu) barrier and seed layer on the backside of the substrate and in the TSV along the tapered wall.

17. The method of claim 15, wherein the forming the plated copper layer on the backside of the substrate and in the TSV along the tapered wall and over the TSV bottom includes growing an oxide layer on the backside of the substrate and then the plated copper layer.

18. The method of claim 15, further comprising, applying an under bump metal (UBM) etch to the plated copper layer.

19. The method of claim 15, further comprising:
forming a solder resist layer; and
forming a wafer bump or a ball in contact with the plated copper layer.

20. The method of claim 15, further comprising:
affixing a dicing tape to the substrate;
dicing the substrate into an individual IPD die comprising the at least one passive component embedded in the insulator material layer; and
picking the individual IPD die from the dicing tape.

* * * * *